United States Patent
Fix et al.

(10) Patent No.: US 6,817,823 B2
(45) Date of Patent: Nov. 16, 2004

(54) METHOD, DEVICE AND SYSTEM FOR SEMICONDUCTOR WAFER TRANSFER

(75) Inventors: Edward R. Fix, Boise, ID (US); William W. Becia, Boise, ID (US); Douglas R. Farnlund, Meridian, ID (US); Sven Evers, Boise, ID (US)

(73) Assignee: Marian Corporation, Boise, ID (US)

( * ) Notice: Subject to any disclaimer, the term of this patent is extended or adjusted under 35 U.S.C. 154(b) by 93 days.

(21) Appl. No.: 10/241,244

(22) Filed: Sep. 10, 2002

(65) Prior Publication Data

US 2003/0057130 A1 Mar. 27, 2003

Related U.S. Application Data

(60) Provisional application No. 60/322,900, filed on Sep. 11, 2001.

(51) Int. Cl.[7] .............................................. B65B 21/02
(52) U.S. Cl. .................. 414/217; 414/416.08; 414/938
(58) Field of Search ............................. 414/217, 217.1, 414/416.03, 416.08, 937, 938

(56) References Cited

U.S. PATENT DOCUMENTS

| | | | | |
|---|---|---|---|---|
| 4,746,256 A | * | 5/1988 | Boyle et al. ............. | 414/217.1 |
| 5,261,935 A | * | 11/1993 | Ishii et al. ................... | 414/937 |
| 6,315,512 B1 | * | 11/2001 | Tabrizi et al. .............. | 414/217 |
| 6,318,944 B1 | * | 11/2001 | Shimeno et al. ....... | 414/416.08 |
| 6,460,270 B2 | * | 10/2002 | Kato et al. .................. | 414/217 |

* cited by examiner

Primary Examiner—James R. Bidwell
(74) Attorney, Agent, or Firm—Your Intellectual Property Matters, LLC.; Robert A. Frohwerk

(57) ABSTRACT

The invention relates to a wafer transfer system that achieves high efficiency, as measured by throughput rate. This is accomplished in one instance by the combination of reliable transfer of single wafers between ports while being simultaneously rotated to accomplish notch alignment. Another instance allows for simultaneous tilting of a multitude of wafers, such as changing the entire load of a transfer cassette between horizontal and vertical orientations, rather than operating on individual wafers serially. Furthermore, the design of this system renders it usable in both left-handed and right-handed workflow arrangements, not requiring construction of mirror-image systems and thereby achieving an economy of scale in production and inventory of the wafer transfer system itself.

16 Claims, 7 Drawing Sheets

METHOD, DEVICE AND SYSTEM FOR SEMICONDUCTOR WAFER TRANSFER

CROSS-REFERENCES TO RELATED APPLICATIONS

This application claims the benefit under 35 U.S.C. 119(e) of U.S. Provisional Patent Application Ser. No. 60/322,900 filed on Sep. 11, 2001 entitled "Method, Device, and System for Semiconductor Wafer Transfer" which is hereby incorporated herein by reference.
U.S. Patent Documents

| | | | |
|---|---|---|---|
| 3930684 | Jan. 6, 1976 | Lasch, Jr., et al. | 406/12 |
| 5575611 | Nov. 19, 1996 | Thompson, et al. | 414/810 |
| 5601484 | Feb. 11, 1997 | Adler, et al. | 454/187 |
| 6053688 | Apr. 25, 2000 | Cheng; David | 414/416.03 |
| 6079927 | Jun. 27, 2000 | Muka; Richard S. | 414/217 |
| 6091498 | Jul. 18, 2000 | Hanson, et al. | 356/623 |
| 6129496 | Oct. 10, 2000 | Iwasaki, et al. | 414/222.01 |
| 6342137 | Jan. 29, 2002 | Woodruff, et al. | 204/297.06 |
| 6305898 | Oct. 23, 2001 | Yamagishi, et al. | 414/744.5 |
| 6364593 | Apr. 2, 2002 | Hofmeister, et al. | 414/217.1 |

U.S. patent applications Ser. No. 20020009357 Jan. 24, 2002 Hanson, Kyle; et al. 414/639
Other References
Patent Abstracts of Japan, Publication No. 2002043395A, published Jun. 1, 1992, 1 page.
Patent Abstracts of Japan, Publication No. 2002043395A, published Feb. 8, 2002, 1 page.
Patent Abstracts of Japan, Publication No. 2000188316A, published Jul. 4, 2000, 1 page.

STATEMENT REGARDING FEDERALLY SPONSORED RESEARCH OR DEVELOPMENT

Not Applicable

SEQUENCE LISTING OR PROGRAM

Not Applicable

BACKGROUND OF THE INVENTION

1. Field of the Invention

This invention relates generally to a method, device and system for semiconductor wafer transfer in an automated wafer transfer system (WTS) for wafer processing.

2. Description of the Related Art

The semiconductor industry continues a predictable trend toward higher densities of the features within integrated circuits. From the 10-micron range in 1970, feature dimensions of 0.13-micron are now common. These extremely high densities have driven the need for extremely clean processes within semiconductor fabrication facilities. The concern for contamination has been only one force driving the automation of processes and the removal of human operators from the processing area.

As the features within devices have become smaller, the devices themselves have grown larger to accommodate greater functional complexity. With that has come a growth in the size of wafers. Larger wafers allow for more devices with a smaller percentage of devices being lost at the circumference of the wafer. As more devices are produced with fewer wafers being handled, the manufacturing cost of each device can be reduced.

When the first generation of microcomputer chips reached production volumes, they were being fabricated on 2-inch diameter wafers. In 1994 sales of 200-mm (8-inch) diameter wafers began and those involved in industry standards agreed that 300-mm (12-inch) would be the next step in size. In 1998, the first robots for handling 300-mm wafers came into being, although hardware standards for wafer carriers, load ports and other now common component subassemblies of Automated Material Handling Systems would not be published for another two years. The industry has now settled on transport carriers containing 25 of the 300-mm wafers. This means that a full carrier weighs significantly more than humans can carry safely and reliably. Also, considering that a single finished wafer may be valued at more than $200,000, extreme care is required in the handling of wafers to avoid even the slightest damage, furthering the need for robotic assistance. Not many human operators can be trusted to repetitiously lift a heavy carrier containing $5-million of product at the end of a long work shift, but this is of lesser concern for a tireless robot.

Given these and other considerations, a high level of automation is employed for handling semiconductor wafers during fabrication. The processing environment is commonly arranged as a wafer transfer system (WTS) that supplies wafers to a process section, often referred to as a bench, having its own separate process automation and wafer handling.

As the semiconductor industry has developed into a commodity market with high volumes and low margins, it has become extremely important to create and adopt standards wherever possible. One such standard, developed specifically for use with 300-mm wafers, is a transport carrier and storage device known as a Front Opening Unified Pod, or FOUP. Containing as many as twenty-five 300-mm wafers, a FOUP is a sealed case with a locked panel. The panel can be removed by automation at the WTS for extraction of the wafers while supporting the wafers in an ultra clean environment.

Previous generations of wafer carriers for the smaller (four, six and eight inch) wafers are known as Standard Mechanical Interface (SMIF) pods. In a SMIF pod, the wafers are transported on edge, in a wafer-vertical orientation. This facilitates transfer of wafers between tools since processing applications require that the WTS position the wafers vertically for hand-off to a process bench. Though cassettes of 300-mm wafers are preferably transferred to the bench automation in a wafer-vertical configuration, a FOUP holds wafers in a horizontal orientation, requiring that the wafers be tilted before being presented to the process bench. Once inside a clean chamber, wafers have historically been transferred in open containers, such as cassettes, using various transfer systems.

Because of the high capital cost associated with a wafer fabrication facility, two other considerations come into play. One is the cost per square foot, particularly of the floorspace that lies within cleanrooms. The other is the productivity of that floorspace. Productivity alone is usually measured as throughput in units of wafers per hour (wph), while together the two issues can be quantified as wafers per hour per square-foot. Typically, semiconductor device manufacturers prohibit increases in equipment footprint unless there is a proportional increase in wafer processing throughput.

Considerations for Improvement over the Related Art

Much of the prior art related to the movement of semiconductor wafers focuses on transfer of the wafers from one processing station to the next within the process bench. In many such systems, wafers are loaded into the system one at a time, through an air-locked slit to reduce the chance of introducing contaminants to the bench. Other systems accept a transport carrier, such as a SMIF or FOUP, mounted to an air-locked panel, from which wafers are removed, one or more at a time, for processing.

It is important that the WTS automation be fast and reliable so that the bench has a constant supply of wafers readily available for processing. Typically, the industry has seen WTS throughput in the range of 200–300 wph. This means that the WTS in such a scenario can supply the bench with eight to twelve 25-wafer cassettes every hour.

In order to increase throughput rates, equipment manufacturers have added a buffer to the wafer handling tool. The buffer serves as a storage area for wafers until they are ready to be processed or removed from the tool. This local stock of wafers reduces the risk of the processing system running idle for lack of wafers. U.S. Pat. No. 6,079,927 "Automated wafer buffer for use with wafer processing equipment" shows one approach for stocking wafers within their over-sized protective FOUPs at the front-end (operator side) of the WTS. Other systems may provide buffered storage in more space-efficient open cassettes at the back-end of the WTS, nearer the process bench. Separate buffering equipment, due to the physical space it requires, increases the footprint of the entire processing system. It also introduces additional interfacing requirements. However, buffers can significantly increase throughput by being an ever-ready source of wafers for the bench. This trade-off is evaluated by individual chip manufacturers based on their specific process and application requirements. Without regard to the presence or absence of a buffer, or where such optional buffer might reside, it is the task of a WTS to transfer wafers from the FOUP to the process bench and back while presenting each wafer in the proper orientation according to the interface requirements of each port.

As buffer systems have grown in capacity, they have also grown in physical dimensions. The resulting distances involved in transporting wafers and their cassettes have been traversed using mechanisms appropriate to the dimensions. These mechanisms have included trolleys, and gantry and crane systems. Even robotic carts have been used to cover longer distances guided by wire or tape on floors. Much of the prior art describes such mechanisms as they are used not only for external buffer storage but also within the process automation itself for transferring wafers from one process station to the next.

While high production throughput rates are important to chip manufacturers, so is product quality. Process analysis is a key element in determining the quality of the product that is output from the system. In order to gather data for the process side of the system, it is required that all wafers be subjected to the chemicals in the same manner. This may be accomplished in three ways.

In a first means, the wafers are introduced to the chemicals in a vertical position as mentioned above. For wet processing applications, this ensures that the liquid flow of chemicals around the wafers is equivalent and that all wafers are exposed to the chemicals for equal amounts of time.

In a second means, each wafer is manufactured with a 3 mm notch cut into its circumferential edge. Aligning the wafers in the same position relative to a known datum allows the process engineers to analyze similar data for each wafer. Wafers are placed in FOUPs randomly; the wafers are not aligned and the position of the notch is unknown. A notch alignment function may or may not be required, depending on customer or process requirements. When required, it is the responsibility of the WTS to perform notch alignment, ensuring that all wafers are similarly positioned before the bench processes them. Most WTS designs that do provide notch alignment have a separate location for this functionality. Beyond increasing the floorspace requirements, the separate location and the associated moves to transfer the wafer to and from that location affect throughput of the tool and introduce additional potential for damage to the wafer. The added feature of performing notch alignment requires time and extreme caution, which negatively affects throughput rates. However, in order to be sure that a system is producing quality product, notch alignment is becoming an essential feature for achieving quality metrics.

A third means of safeguarding the quality of the chemical process is to process only cassettes that are fully loaded with wafers. If a cassette is uniformly filled to capacity for each process cycle, it is assumed that chemical flow to each wafer is consistent within each process cycle. Although a FOUP contains 25 slots, they are not always presented to the WTS containing a complete set of wafers. Additional FOUPs can be delivered to the WTS to complete a cassette. Alternately, WTS designs may incorporate test wafer stations that contain filler, or dummy, wafers. The WTS automation can access these wafers and load them into a cassette to reach cassette capacity.

Basic Operations in the Related Art

Many systems have been constructed that accomplish the transfer of wafers in keeping with the foregoing discussion. Each of those systems may be described in terms of their subassemblies. It is desirable to simplify the WTS by reducing it to a minimal set of subassemblies, and furthermore to interconnect said subassemblies to operate in an efficient manner.

The main functions of a WTS are to:

unload wafers from a FOUP, load said wafers into a cassette, position the wafers vertically for hand-off to the process bench, unload a processed cassette, and load processed wafers back into a FOUP.

To minimize contamination, wafer handling tools typically have separate input and output paths for wafer transfer. The input path handles the 'dirty' wafers, those that have not yet been processed, whereas the output path handles 'clean' wafers, those that have been processed by the bench. The input path functions are to unload wafers from the FOUP and load cassettes with wafers. Additionally, it is in the input path where notch alignment is performed where applicable. The output path automation unloads processed wafers from cassettes and places them into a FOUP for removal from the tool. Other operations are not restricted to either path and are accessible and utilized by both lines. Functions that may be included in either path include the insertion and removal of test wafers to fill a cassette, and the buffering of cassettes in a storage area.

The transfer begins by supplying wafers to the WTS. The FOUP is set onto a load port at the WTS and the pod door is opened to expose the wafers to the WTS. The WTS automation unloads the wafers one at a time and places them into a cassette. The cassette is an open carrying case including combs for holding the wafers at three or four points of contact. Although the wafers are oriented horizontally in the FOUP, the wafers must be presented to the bench automation in a vertical position (that is, standing on edge) for exposure to process chemicals within the bench. Some WTS designs extract the wafer horizontally, rotate and twist it into a vertical position and then set the wafer down into a horizontally seated cassette. Such a method of transfer increases the potential of damage to each wafer as it undergoes an extensive set of motions before reaching the cassette. Not only is damaged product a concern, but this method also negatively impacts throughput and reliability of the WTS itself by introducing a complicated set of motions.

After the wafers are positioned in the cassette, the bench automation retrieves the cassette and subjects the wafers to chemical processes as dictated by a recipe. When processing is complete, the bench automation delivers the cassette of processed wafers to the WTS. The WTS unloads the processed wafers from the cassette into the FOUP. Once it is completely filled, the operator may remove the FOUP of processed wafers from the load port and introduce another FOUP of unprocessed wafers to continue wafer processing.

SUMMARY OF THE INVENTION

In view of the foregoing discussion, the present invention seeks to provide a wafer transfer system that is an improvement over the prior art in the following areas:

it makes more efficient use of floorspace with methods and devices that accomplish more functionality in a smaller footprint;

it offers methods and devices that are inherently more efficient by reducing the number of motions that are necessary to accomplish the required tasks as well as reducing the extent of travel of those motions that remain necessary, thereby increasing throughput;

it increases system reliability by reducing the number of discrete machines; and it reduces initial capital outlay as well as ongoing maintenance costs by its inherent ability to interface to both left-handed and right-handed process benches.

The wafer transfer system (WTS) of the present invention includes five main subassemblies:

(a) a Load Port,
(b) a Wafer Transfer Robot (WTR),
(c) a Cassette Inversion Mechanism (CIM),
(d) a Test Wafer Station (TWS), and
(e) a Cassette Buffering Station (CBS).

In addition, and as an alternate embodiment of the present invention, the WTS may include an Integrated Notch Aligner (INA).

The WTS and the process bench are integrated so that wafer transfer and processing occur seamlessly. Separate input and output paths are maintained as described above to minimize contamination. The input path automation consists of one Load Port, a WTR, and a CIM. When applicable, notch alignment is performed in the input path by an INA. Automation in the output path includes one Load Port, a WTR without notch alignment capability and a CIM. The CBS and an optional TWS are available to both paths.

Wafers are supplied to the WTS by placing a FOUP onto a Load Port. The Load Port includes an external shelf having a clamping element for holding a FOUP in place for loading and unloading operations. The FOUP may be situated on the Load Port such that the sides of the FOUP case mate with the outside panels of the WTS to prevent contaminants from entering the WTS. The Load Port also includes a Pod Door Opener (PDO), for removing the Front Opening door of the FOUP.

The Wafer Transfer Robot interfaces with the FOUP at the Load Port, with the CIM, and with the TWS. The WTR is a SCARA type robot, known in the art, including y-axis and z-axis translation capability and theta rotation, where the x-axis is taken to be parallel to the plane where the openable face of the FOUP mounts to the Load Port. The WTR includes a substantially horizontal rail that is mounted to a pedestal. The rail lies along a y-axis. The pedestal includes a rail transport mechanism configured to allow vertical translation of the rail in the z-axis. The WTR also includes an arm attached to the rail. The arm is capable of both lateral translation along the y-axis on the rail and theta rotation about a point of attachment of the arm to the rail. In the basic embodiment the arm includes a generally Y-shaped end effector, which is known in the art, for lifting and holding one wafer at a time for transfer by the WTR.

The Cassette Inversion Mechanism (CIM) interfaces with the WTR and the Cassette Buffering Station (CBS). The CIM includes a rotatable pedestal to which a pivotable arm is connected. A cassette holder is connected at a distal end of the pivotable arm. The pivotable arm is capable of vertical translation along a z-axis up and down the rotatable pedestal allowing the cassette holder to be raised or lowered as required for placement of wafers in, or removal of wafers from, the cassette holder by the WTR. The cassette holder includes a cassette locking member for holding the cassette in place in the cassette holder. The cassette holder includes a plurality of grooved fingers for supporting the wafers in the cassette. The CIM has two axes of motion: rotation about a vertical axis and a tilting motion of approximately 90° at the pivotable arm to position the cassette in a wafer horizontal orientation for loading or unloading by the WTR, or a wafer vertical orientation for placement of the cassette at, or removal of the cassette from, the cassette buffering station. The CIM can simultaneously position multiple wafers horizontally or vertically with a motion that is coordinated between the rotatable pedestal and the pivotable arm. The CIM may include safety mechanisms designed to indicate that the cassette is firmly held in the CIM. In addition, the CIM is designed such that it can hold any wafer cassette, whether generic or custom. An advantage of the present invention over the prior art is that the CIM provides for simultaneous inversion of multiple wafers in a cassette, therefore increasing reliability and reducing risk of damage to the wafers. Furthermore, the CIM of the present invention increases throughput by facilitating wafer transfer entirely within a horizontal plane.

The Test Wafer Station (TWS) is positioned adjacent to the WTR near the FOUP such that a wafer positioned in the TWS may be retrieved by the WTR. The TWS holds one or more test wafers. Test wafers may be withdrawn from the TWS for placement in a cassette in order to fill the cassette for processing. When processing is complete, the WTR removes the test wafer from the cassette and returns the same test wafer to the TWS.

The Cassette Buffering Station (CBS) of the present invention uses the necessary exchange point with the process bench as a buffer storage area. This approach adds integral cassette storage capacity to the WTS without the separate buffering equipment that is typically purchased and integrated to provide the same functionality. This integral cassette buffering station has the advantage of an overall smaller footprint for the process system. It also requires no additional interfaces and reduces the number of machines required, thereby improving reliability while providing the process bench with an ever-ready supply of cassettes.

In an alternate embodiment of the invention, the WTS includes an Integrated Notch Aligner (INA). The INA is positioned adjacent to the rail of the WTR and is parallel to the rail and the y-axis such that notch alignment can be performed as the WTR is transferring the wafer to the cassette along the y-axis. The INA includes a vacuum chuck located at substantially 90° rotation from the face of the FOUP. The vacuum chuck applies suction at a face of the wafer in order to hold the wafer while a drive spins the wafer and a laser or other visioning system locates a wafer notch. This approach improves over the prior art by aligning the wafer within the horizontal path between the FOUP and the cassette without the WTR deviating from that transfer path.

BRIEF DESCRIPTION OF THE DRAWINGS

These and various other features and advantages of the present invention will be readily understood with reference to the following detailed description taken in conjunction with the accompanying drawings.

DESCRIPTION OF THE PREFERRED EMBODIMENTS

Embodiments of the present invention will be described below with reference to the accompanying drawings.

As noted previously, the methods and devices of this invention are disclosed herein with particular reference to a system for the automatic transfer of fragile wafers of material as widely used in the semiconductor electronics industry. In addition to the basic operation of wafer transfer, the disclosed system optionally includes pre-alignment and buffered storage of the wafers that have been presented to the system. However, it should be understood that the novel combination and subcombinations of the herein disclosed features have applicability to other fields in which articles analogous to semiconductor wafers require alignment or buffered storage or other specialized handling, as described herein, prior to the subsequent treatment of those articles.

Furthermore, it should also be understood that the various features of this invention, while highly effective when combined to provide an integrated apparatus such as the automatic Wafer Transfer System disclosed herein, have applicability independently of each other in the transfer, handling, pre-alignment, and storage or other treatment of semiconductor wafers or analogous material.

Figure 1:
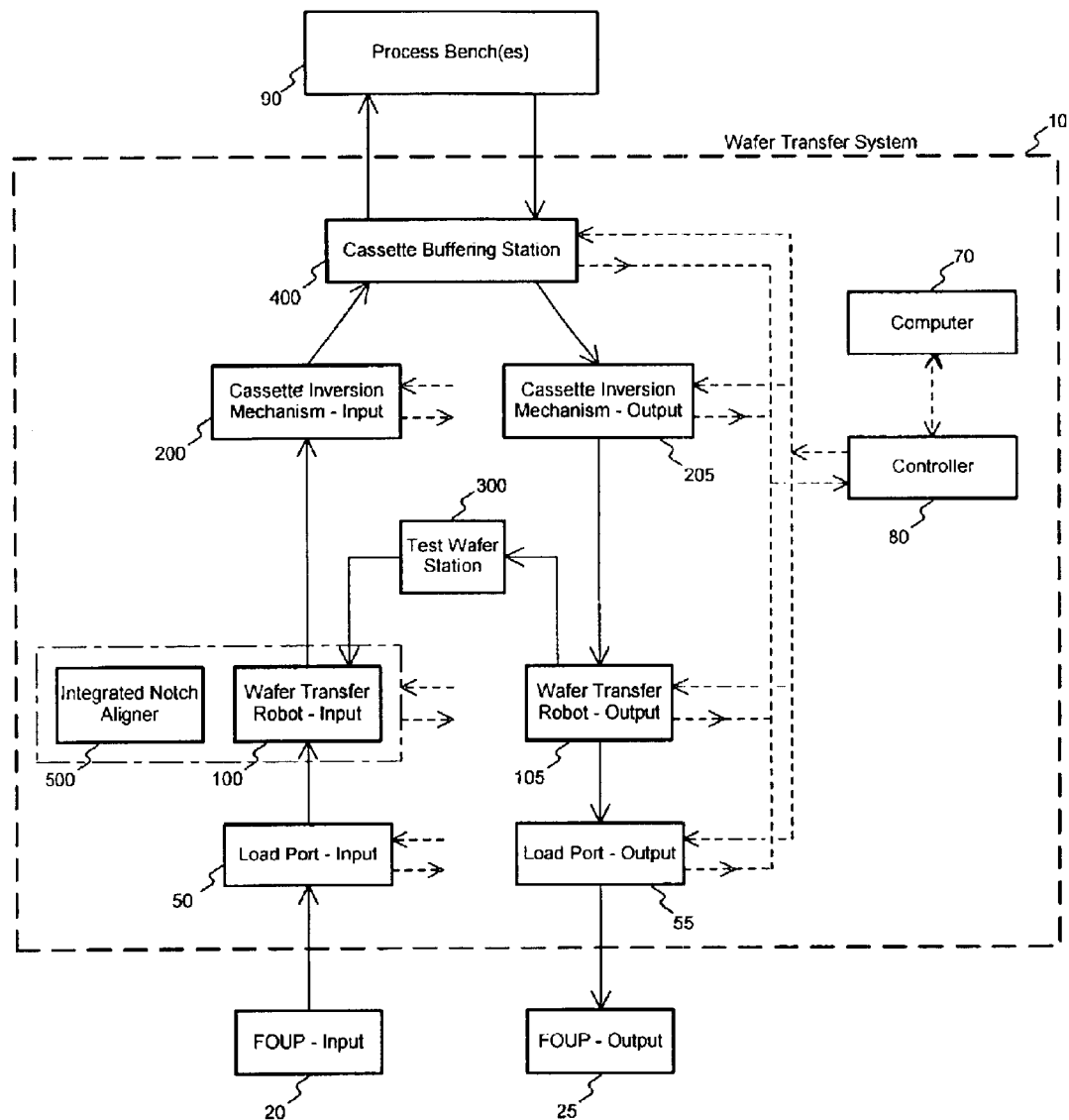
FIG. 1 is a Functional Block Diagram of the Preferred Embodiment of a Wafer Transfer System according to the present invention.

The Functional Block Diagram of FIG. 1 shows the Preferred Embodiment with an input path to handle "dirty" unprocessed wafers separate from an output path for "clean" processed wafers. With the exception of the Integrated Notch Aligner (INA) 500, the subsystems are symmetrical between the two paths. This symmetry reduces the count of unique components comprising the wafer transfer system WTS 10 thereby providing for an economy of scale in the manufacture and support of the WTS 10 itself.

Controller 80 is in communication with each of the robotic subsystems within the WTS 10 to issue commands to and receive status information from them. Computer 70 oversees the entire WTS 10 automation through a communication interface with Controller 80. The objective of the entire WTS 10 is to transfer semiconductor wafers between one or more FOUPs (20 and 25) and Process Bench(es) 90.

Although Process Bench(es) 90 is depicted here as a single block, it is so labeled to point out that it may comprise a single or multiple processing systems within the block. It is an important advantage of the present invention that multiple processing systems are supported simultaneously by the WTS 10 through the particular Cassette Buffering Station 400 described herein. Additionally, many of the processing systems that are supported in the block labeled Process Bench(es) 90 are restricted to either left-hand or right-hand interfaces to a wafer transfer system. This restriction requires that other wafer transfer systems be made available in both left-hand and right-hand configurations. The WTS 10 of the present invention, through its Cassette Buffering Station 400, inherently accommodates both left-hand and right-hand configurations in a single WTS 10, whether Process Bench(es) 90 comprises a single or multiple processing systems.

Figure 2:
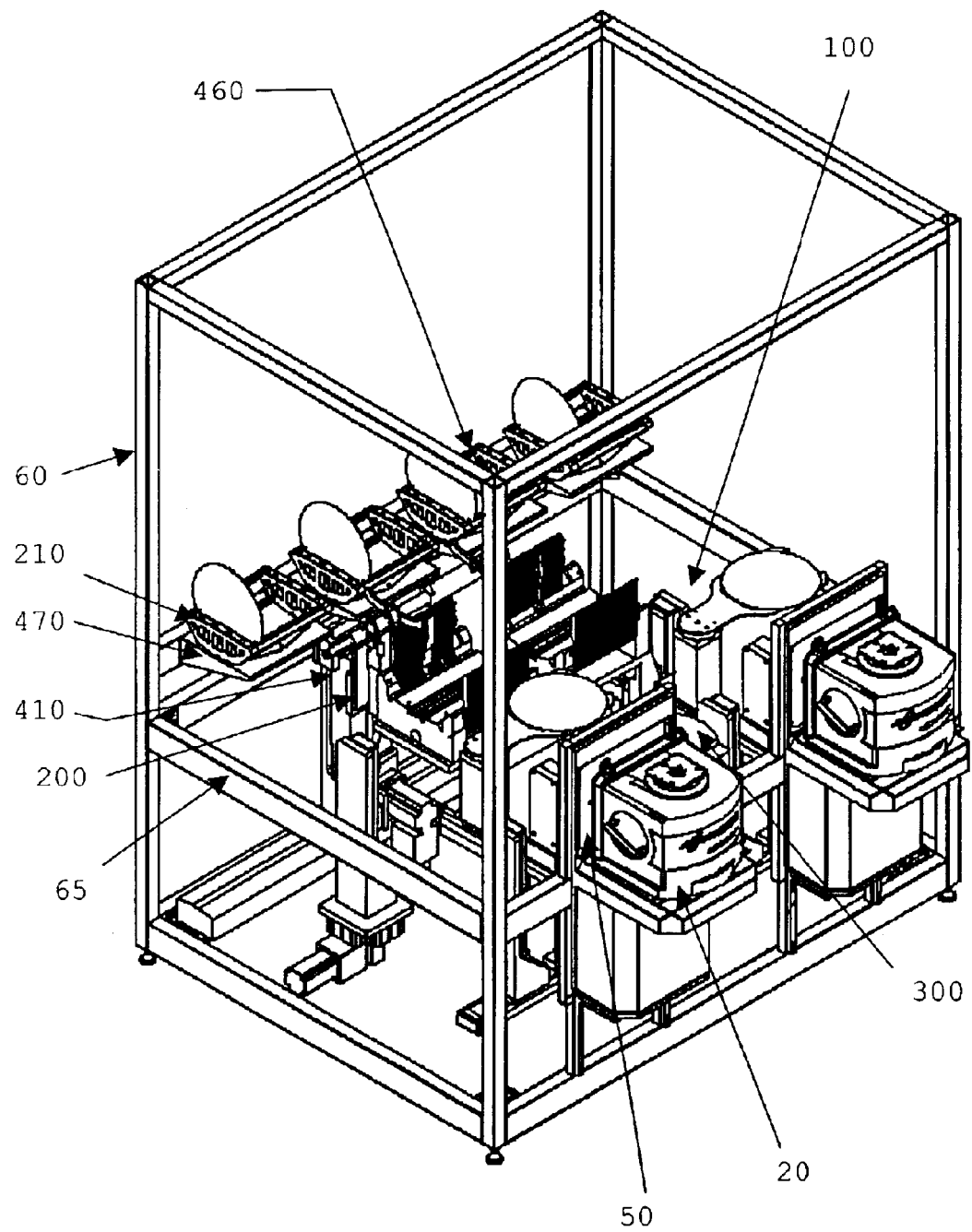
FIG. 2 is a representative perspective view of a Wafer Transfer System according to the present invention.
Figure 3:
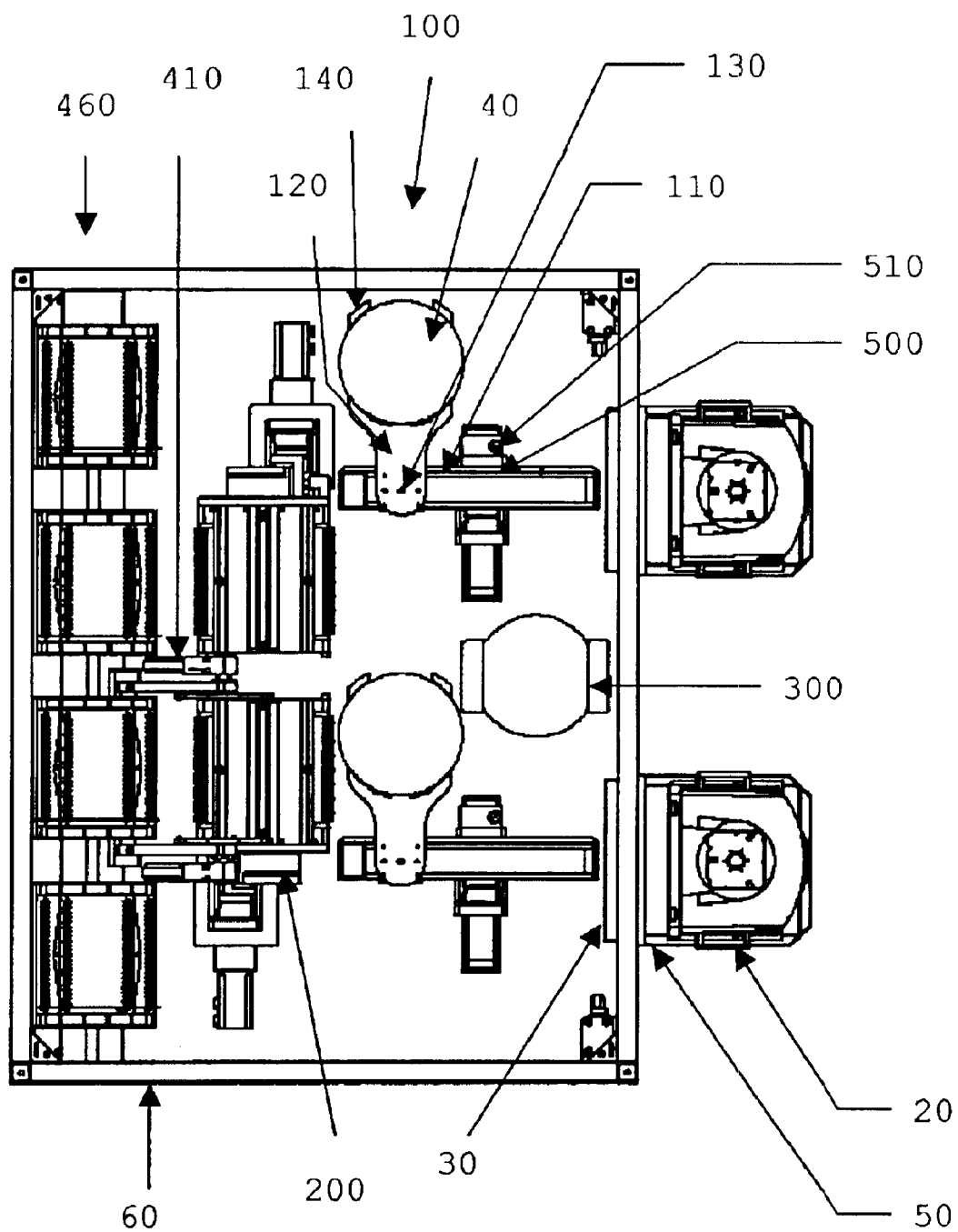
FIG. 3 is a representative top view of a Wafer Transfer System according to the present invention.
Figure 4:
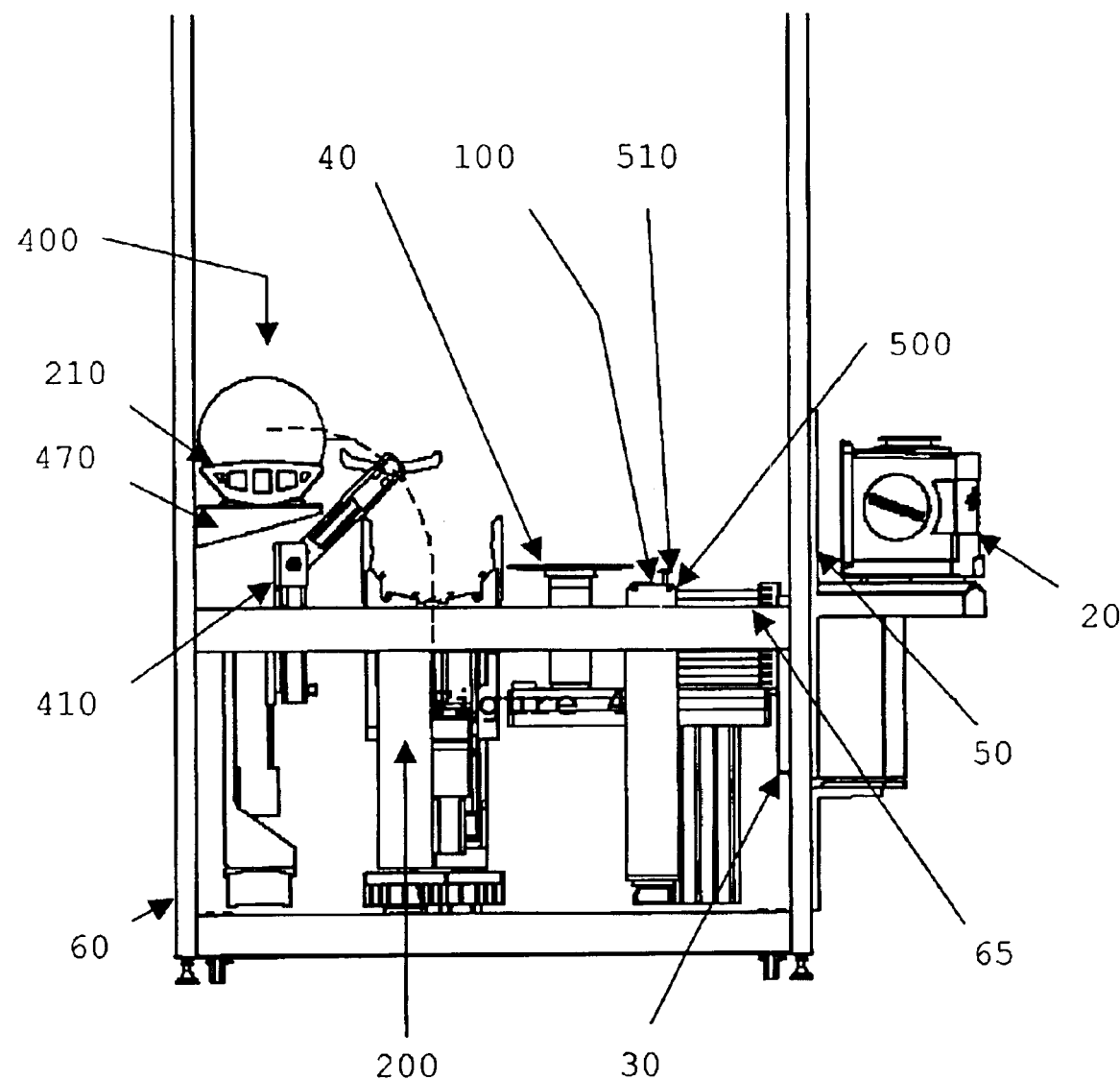
FIG. 4 is a representative side view of a Wafer Transfer System according to the present invention.

The three FIGS. 2, 3 and 4 show the component devices of the wafer transfer system WTS 10 of the present invention in three views, perspective, top and side, respectively. The system includes five main subassemblies:
 (a) a Load Port 50,
 (b) a Wafer Transfer Robot (WTR) 100 with an Integrated Notch Aligner (INA) 500,
 (c) a Cassette Inversion Mechanism (CIM) 200,
 (d) a Test Wafer Station (TWS) 300, and
 (e) a Cassette Buffering Station (CBS) 400.
All subassemblies are mounted to a structural frame 60. The robotics of the WTS 10 automation are controlled by Controller 80 under the supervision of Computer 70.

In operation, a FOUP 20 containing a collection of one or more wafers, which are in a horizontal orientation, is placed at a Load Port 50 where the FOUP 20 is locked into place to prevent contaminants from entering the WTS 10. The FOUP 20 is then opened by a Pod Door Opener (PDO) 30 which is shown for location purposes only but is not detailed here as it is known in the art. A typical PDO 30 will engage pins to support the openable face of the FOUP 20, then the PDO 30 will rotate locking devices built into the openable face to unlock it, pull it away from the FOUP 20 and move it to a holding position below the deck plane 65 of the working area within the WTS 10. The majority of the automation components and all of the wafer transferring exist above the deck plane 65. The majority of the electrical and mechanical assemblies function below the deck plane 65. This prevents contamination, enhances safety measures, and facilitates servicing of the WTS 10. The details of the Load Ports 50 and 55 along with their associated pod door openers are unimportant. These subassemblies, though physically located within the environment of the WTS 10, serve merely as an interface to FOUPs 20 and 25 for the exchange of wafers. For dimensional references herein, consider the openable face of the FOUP 20 as attaching to the Load Port 50 in an xz-plane and that the y-axis extends backward, away from such a mounting plane, toward where the WTS 10 interfaces with Processing Bench(es) 90.

The WTR arm 120 moves along horizontal rail 110 on the y-axis (refer to FIG. 5 for a detailed close-up) and rotates about its point of attachment 130 (to the horizontal rail 110) in order to position the Y-shaped end effector 140 at the openable face of the FOUP 20. The WTR arm 120 then moves along the horizontal rail 110 to drive the Y-shaped end effector 140 into the FOUP 20 coming to a position directly below and in proximity to a wafer 40. The WTR pedestal 150 (in FIGS. 6 and 7) raises the horizontal rail 110 vertically along the z-axis, lifting the wafer 40 from its support in the FOUP 20. The WTR arm 120 then reverses along the horizontal rail 110 withdrawing the wafer 40 from the FOUP 20. The WTR arm 120 then rotates about its point of attachment 130. With the wafer resting on the end effector 140, fully removed from the FOUP 20, the WTS 10 can perform notch alignment.

Figure 5:
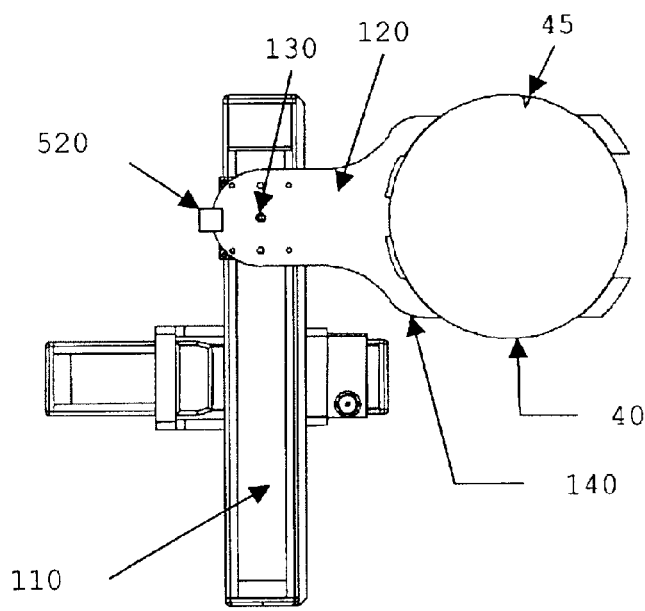
FIG. 5 is a representative top view of a Wafer Transfer Robot with Integrated Notch Aligner according to the present invention.
Figures 6, 7:
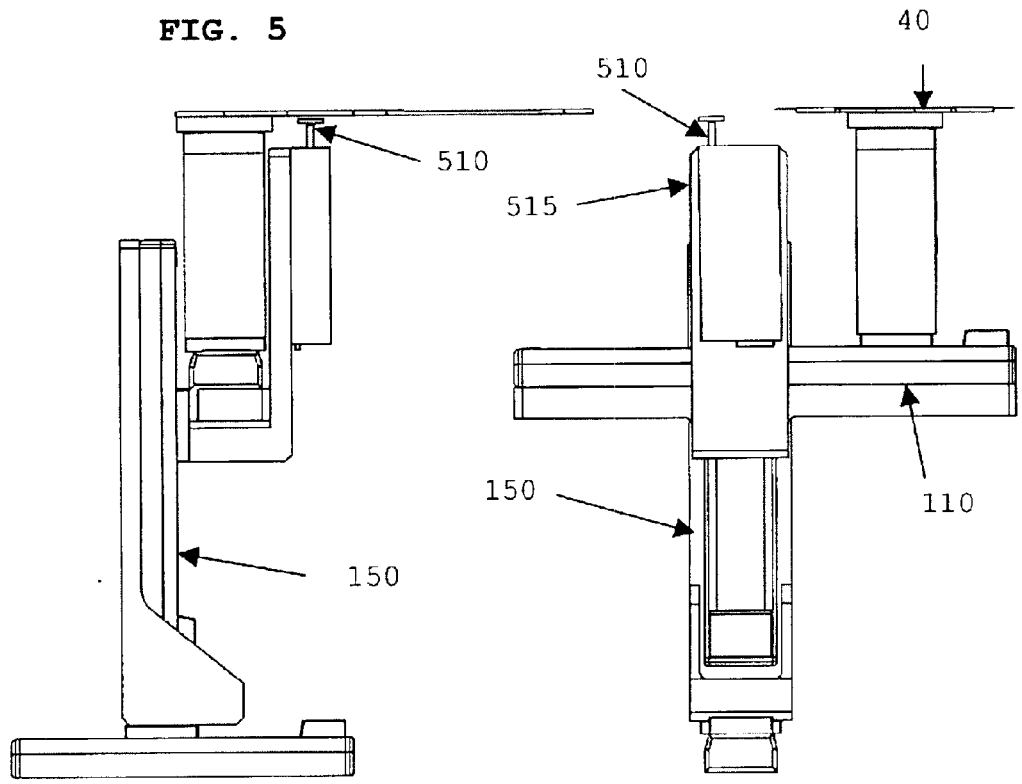
FIG. 6 is a representative side view of a Wafer Transfer Robot with Integrated Notch Aligner according to the present invention.
FIG. 7 is a representative front view of a Wafer Transfer Robot with Integrated Notch Aligner according to the present invention.

FIGS. 6 and 7, along with FIG. 5, are useful to understand the Integrated Notch Aligner (INA) 500 in relation to the Wafer Transfer Robot WTR 100. The INA 500 comprises a vacuum chuck 510 with a rotary drive 515. To begin integrated notch alignment, the WTR arm 120 rotates, positioning the end effector 140 above the vacuum chuck 510. The WTR lowers the wafer 40 to position the center of the wafer 40 on top of the vacuum chuck 510. The end effector 140 remains in this position until the notch is aligned. The vacuum chuck 510 applies a vacuum to the wafer 40 holding the wafer while the wafer is spun by a rotary drive 515. The laser 520 locates the notch 45. Once the notch 45 is found, the rotary drive 515 turns the vacuum chuck 510 to rotate the wafer 40 in order to place the notch 45 in a pre-selected position. The WTR 100 raises the end effector 140 lifting the wafer 40 from the vacuum chuck 510.

The INA 500 integrates notch alignment with the wafer loading sequence. Systems of notch alignment in the prior art deposit wafers to a separate machine for alignment from which they are then retrieved by yet another machine. That method has a larger footprint and lower system reliability than the method disclosed herein. The INA 500 of the present invention introduces a timesaving element by eliminating both the need for a separate mechanism and the number of wafer transfer motions. The INA design herein described also provides more reliable notch alignment functionality than the prior art since reducing the number of moves in the automation results in a safer method of wafer transfer. Also, total footprint of the tool can be reduced since a separate location for notch alignment is not necessary.

Once the wafer 40 is removed from the FOUP 20, and notch alignment, if incorporated, is complete, the WTR arm 120 continues rotation and travel along the horizontal rail 110 towards the Cassette Inversion Mechanism (CIM) 200 until the end effector 140 is positioned at substantially 180° rotation away from the openable face of the FOUP 20. The end effector 140 and wafer 40 are now positioned directly in front of a cassette 210 for insertion of the wafer 40 into the cassette 210.

Figure 8:
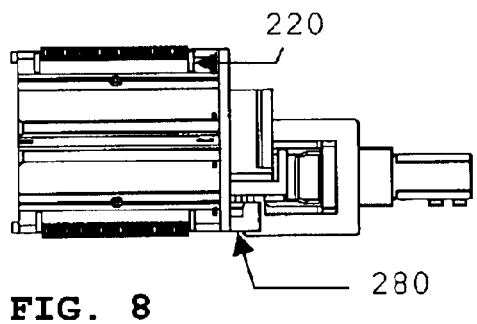
FIG. 8 is a representative top view of a Cassette Inversion Mechanism according to the present invention.
Figure 9:
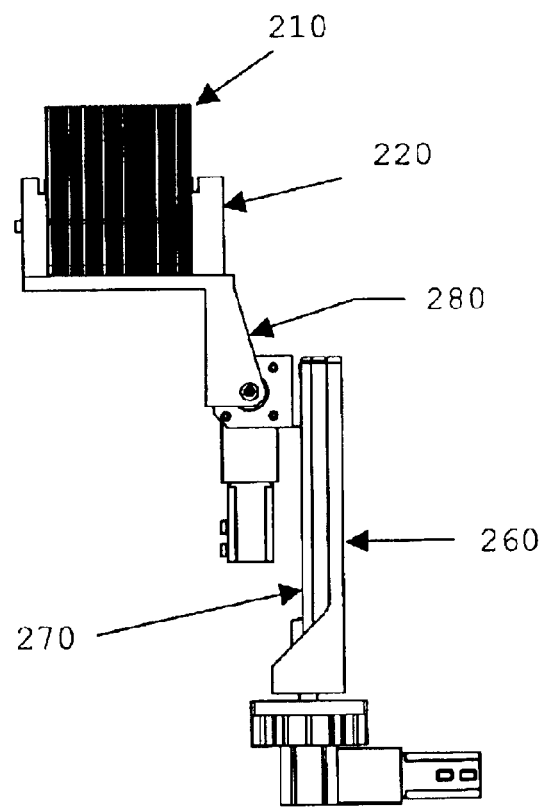
FIG. 9 is a representative side view of a Cassette Inversion Mechanism according to the present invention.
Figure 10:
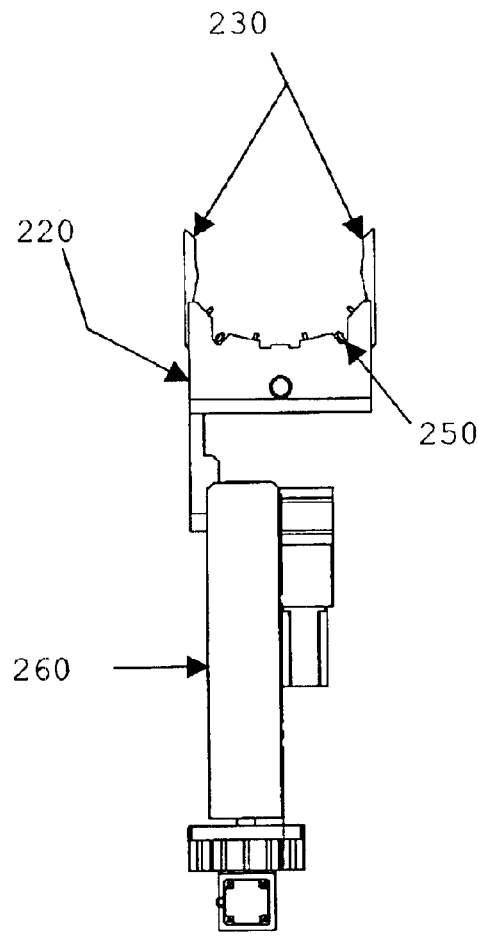
FIG. 10 is a representative front view of a Cassette Inversion Mechanism according to the present invention.

The Cassette Inversion Mechanism (CIM) 200, described in FIGS. 8, 9 and 10, comprises a cassette holder 220 connected at a distal end of a pivotable arm 280 which in turn is mounted to a vertical rail 270 supported by a rotatable pedestal 260. The cassette 210 may be any one of several open transfer cases commonly used in the industry to accommodate a specific process system at Process Bench (es) 90. Such cassettes typically have slots that include combs 230 for holding the wafers at three or four points of contact; such combs being analogous to the mechanism for supporting wafers within a FOUP 20. The cassette 210 is locked into place in the cassette holder 220 with a cassette locking member 250, as the cassette 210 is loaded with wafers 40 by the WTR 100. The WTR arm 120 advances along the y-axis positioning the wafer 40 horizontally in the cassette 210 above one of a collection of slots. The horizontal rail 110 and attached WTR arm 120 moves vertically down along the z-axis setting the wafer 40 into the slot. The arm WTR 120 then reverses travel along the y-axis towards the FOUP 20 to retrieve the next wafer 40. If wafers are needed from the Test Wafer Station (TWS) 300, the WTR 100 can position as required to retrieve the necessary wafer or wafers. The TWS 300 supports a collection of wafers in a horizontal orientation using a means analogous to the combs of the cassettes.

When initial loading of the cassette 210 begins, the CIM 200 is at its lowest height. This allows the WTR 100 to load the first wafer 40 into the top-most slot of the cassette 210. Due to the high sensitivity to contaminants, the automation should always be below the wafer 40. Loading of wafers is performed from the top down, while unloading is done from the bottom up. For the first wafer transfer, the top slot of the cassette 210, the wafer 40 on the WTR end effector 140, and the bottom slot of the FOUP 20 are in the same horizontal plane. The CIM 200 indexes the cassette 210 upwards in the same increments as the WTR 100, both indexing to the height of the next wafer in the FOUP 20 so that the wafer transfer is always accomplished in a horizontal plane.

After the cassette 210 is fully loaded, the CIM pedestal 260 rotates and the pivotable arm 280 pivots simultaneously to invert the wafers from a wafer horizontal orientation for loading by the WTR 100, to a wafer vertical orientation for placement at the Cassette Buffering Station (CBS) 400. The Cassette Inversion Mechanism of the present invention allows for cassette loading and unloading in a wafer horizontal orientation. The Cassette Inversion Mechanism of the present invention also allows for inversion of the cassette in a single coordinated motion so that the wafers are positioned in a wafer vertical orientation reducing wafer transfer time, increasing throughput and ensuring safe product handling.

The Cassette Buffering Station (CBS) 400 (see FIG. 4) is located at the back of the WTS 10 in proximity to the Process Bench(es) 90. The CBS 400 interfaces with the CIM 200 and processing bench automation included in the Process Bench(es) 90. The CBS 400 contains two subsystems (FIGS. 2 and 3): a Buffer Queue and Storage Area 460, and a Cassette Buffer Handling Mechanism 410. The Buffer Queue and Storage Area 460 contains a plurality of shelves 470 that are static. The shelves 470 are attached to a frame member near the back of the WTS frame 60 and are located so as to be accessible by the automation of the Process Bench(es) 90 and the Cassette Buffer Handling Mechanism 410. Each of the plurality of shelves 470 includes placement pins to ensure proper placement and alignment of a cassette 210 on the shelf 470 according to the requirements of the specific, perhaps custom, cassette 210. Sensors may also be used to ensure proper alignment of the cassette.

Figure 11:
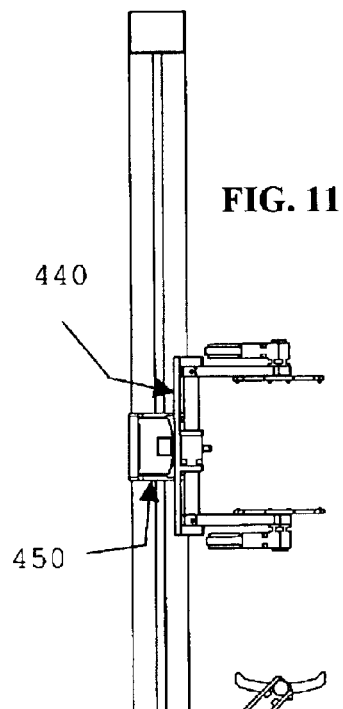
FIG. 11 is a representative top view of a Cassette Buffer Handling Mechanism according to the present invention.
Figure 12:
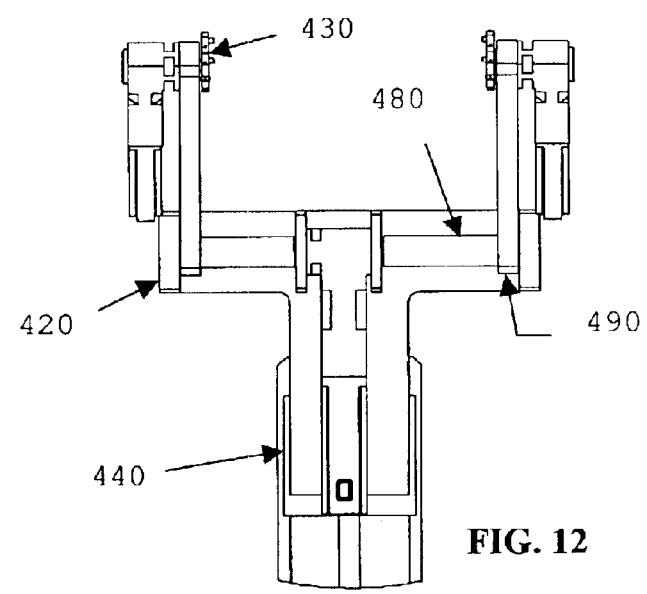
FIG. 12 is an enlarged view representative of a Y-shaped end effector used in a Cassette Buffer Handling Mechanism according to the present invention.
Figure 13:
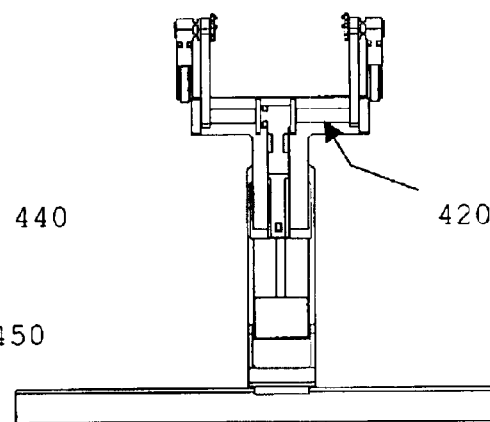
FIG. 13 is a representative side view of a Cassette Buffer Handling Mechanism according to the present invention.
Figure 14:
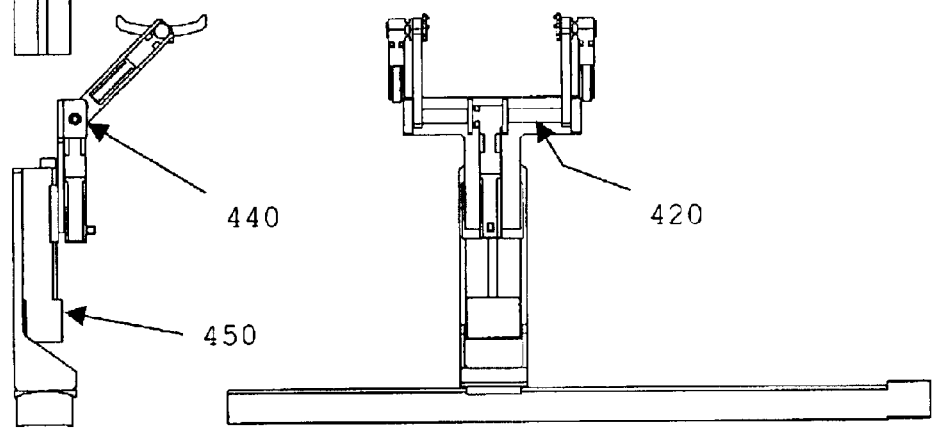
FIG. 14 is a representative front view of a Cassette Buffer Handling Mechanism according to the present invention.

The Cassette Buffer Handling Mechanism 410 (FIG. 3) is located along an x-axis between the Cassette Inversion Mechanism 200 and the Buffer Queue and Storage Area 460. The Cassette Buffer Handling Mechanism 410 (as detailed in FIGS. 11, 13 and 14) includes a motor driven trolley 440 mounted to a carriage 450 for horizontal translation of the trolley 440 along the carriage 450 on an x-axis. A pair of pivotable arms 480 (detailed in FIG. 11) extends from the trolley 440 and is configured to permit rotation of the pair of pivotable arms 480 about a pair of pivotable arm connections 490. The pair of pivotable arms 480 is attached to the trolley 440 in such a manner as to permit translation of the arms along a z-axis. Each of the pair of pivotable arms 480 includes a generally Y-shaped active end effector 420 described elsewhere in the art. Each of the generally Y-shaped active end effectors 420 includes grippers 430 for gripping the cassette 210 firmly during transport.

Once the CIM 200 positions the cassette 210 in the wafer vertical orientation, the carriage 450 of the Cassette Buffer Handling Mechanism 410 travels along the x-axis as required to align the grippers 430 with pins at both ends of the cassette 210. The pivotable arms 480 pivot to position the active end effectors 420 relative to the cassette 210 so that the grippers 430 may secure the cassette 210. Sensors may indicate that the cassette 210 is in position and held securely by the active end effectors 420. The active end effectors 420 may include active or passive safety devices to ensure that the cassette 210 remains securely held, especially in the event of a power failure. The pivotable arms 480 raise the cassette 210 and the trolley 440 traverses along the x-axis on the carriage 450. The pivotable arms 480 align the cassette 210 with one of the shelves 470 in the Cassette Buffering Station 400 and move upward along the z-axis as required to permit the pivotable arms 480 to pivot past top dead center to place the cassette 210 in the CBS 400. Placement pins and sensors on the shelf 470 indicate that the cassette 210 is properly placed. The grippers 430 release the pins of the cassette 210 and the pivotable arms 480 pivot back towards top dead center. The cassette 210 is stored at the Buffer Queue and Storage Area 460 until retrieved by the bench automation of Process Bench(es) 90 for processing. The process bench automation directly interfaces with the WTS 10 at the Buffer Queue and Storage Area 460. Access is provided so that the bench automation of Process Bench (es) 90 can pick up from and drop off to any of the storage shelves 470 in the Buffer Queue and Storage Area 460. Cassette 210 in the Buffer Queue and Storage Area 460 supports wafer 40 in the vertical orientation so as to be ready for immediate direct transfer as needed by the Process Bench(es) 90 for processing.

By adding integral cassette storage capacity to this WTS 10 design, the Cassette Buffering Station 400 reduces the overall floorspace requirement of the process system. Also, since this approach to buffered storage is accomplished without additional interfaces, scheduling and cassette management in this WTS 10 become the responsibility of the WTS 10 under supervision of its dedicated Computer 70 and the associated Controller 80. This offloads the bench automation of Process Bench(es) 90 and allows the bench automation to devote its full functionality to wafer processing, while improving system reliability through reduction of the number of machines required.

An additional advantage to the CBS 400 of the present invention is that the symmetrical design allows one WTS 10 to hand-off or transfer cassettes to more than one discrete processing system within Process Bench(es) 90. Furthermore, the carriage assembly 450 of the CBS 400 is expandable to service multiple processing systems within Process Bench(es) 90, providing a very cost effective cassette buffering solution to many industry customers.

The present invention, described above as an apparatus, also includes a method for wafer transport which includes the steps of picking a wafer 40 from a transport carrier (such as a FOUP 20), the wafer 40 having a wafer horizontal orientation, placing the wafer in a wafer horizontal orientation in a cassette 210 held by a cassette inversion mechanism (CIM) 200, inverting the cassette 210 and the wafer 40 contained in the cassette to a wafer vertical orientation, picking the cassette 210 and the wafer 40 from the cassette inversion mechanism 200 and placing the cassette 210 and the wafer 40 into a cassette buffering station 400 with the wafer in a wafer vertical orientation.

Although the present invention has been described herein with reference to particular embodiments and drawing figures, it should be apparent to those skilled in the art that there are a host of other designs which can be implemented in keeping with the intent of the present invention. For example, although the invention has been described as being used in the automatic handling, transporting and pre-alignment of thin fragile wafers of semiconductor material, and more specifically that which is 300-mm in diameter, the principals of the present invention could be employed in any context in which a compact and efficient handling mechanism is required. The selection, design and arrangement of the various components described herein may be modified without departing from the spirit and scope of the invention as represented in the attached claims.

It should also be understood that the various features of this invention, while highly effective when combined to provide an integrated apparatus such as the herein disclosed wafer transfer system, have applicability independently of each other in the retrieval, handling and pre-alignment or other treatment of wafers or analogous devices of other composition.

We claim:

1. A wafer transfer system, comprising:
   (a) at least one Wafer Transfer Robot for transfer of a wafer between a first collection of wafers supported by a transport carrier and a second collection of wafers supported by a cassette, said wafer having a generally horizontal orientation and the transfer being executed in a generally horizontal plane;
   (b) at least one Cassette Inversion Mechanism for holding said cassette, and for tilting said cassette to cause said second collection of wafers to be shifted between horizontal and vertical orientations; and
   (c) a Cassette Buffering Station for receiving said cassette from the at least one Cassette Inversion Mechanism, and for supplying said cassette to the at least one Cassette Inversion Mechanism;
   wherein each of said at least one Cassette Inversion Mechanism further comprises:
   (b1) a rotatable pedestal to which a vertical rail is attached;
   (b2) a pivotable arm attached to the vertical rail by a mount that is capable of vertical motion along the vertical rail;
   (b3) a cassette holder connected at a distal end of the pivotable arm;
   said cassette holder including
      a cassette locking member for holding said cassette, and
      a plurality of grooved fingers for supporting said second collection of wafers in said cassette.

2. A wafer transfer system as described in claim 1 wherein said Cassette Buffering Station comprises:

(a) a Buffer Queue and Storage Area including one or more shelves; said shelves being statically mounted in sufficient proximity to at least one process tool so that automation within the at least one process tool is able to reach said shelves; and (b) a Cassette Buffer Handling Mechanism capable of placing said cassette on said shelves, including
a motor driven trolley mounted to a horizontal carriage, said trolley being capable of lateral translation along said horizontal carriage;
a pair of pivotable arms mounted to said trolley in such manner as to permit vertical translation of said pair of pivotable arms, said pair of pivotable arms being pivotable up and down in a vertical direction; each pivotable arm of said pair of pivotable arms includes at a distal end a generally Y-shaped active end effector, each said active end effector being known in the art includes grippers for gripping said cassette.

3. A wafer transfer system as described in claim 2 wherein each of said at least one Wafer Transfer Robot is a SCARA type robot, known in the art, capable of y-axis and z-axis translation and theta rotation, including:

(a) a horizontal rail mounted to a pedestal, the pedestal including a rail transport mechanism configured to allow vertical translation of said horizontal rail;

(b) an arm being rotatably attached to the horizontal rail; said arm being capable of lateral translation along said horizontal rail; and (c) a Y-shaped end effector, known in the art, being mounted to said arm.

4. The wafer transfer system of claim 3, further comprising:

(a) an Integrated Notch Aligner mounted adjacent to the horizontal rail of a first instance of said at least one Wafer Transfer Robot, the Integrated Notch Aligner including a vacuum chuck having its chucking surface facing upward and parallel to the lower surface of said wafer, suction from the vacuum chuck being activated to hold said wafer in response to said wafer coming to rest on said chucking surface due to a downward motion of the first instance of said at least one Wafer Transfer Robot;

(b) a rotary drive which causes the vacuum chuck to rotate the wafer so held to said chucking surface; and (c) a visioning system that emits a signal when a notch on the wafer so held is within a pre-selected region, said signal initiating both release of the suction and an upward motion of the first instance of said at least one Wafer Transfer Robot which upward motion lifts said wafer from the chucking surface, said wafer being in a preferred rotational position for deposit into said cassette.

5. The wafer transfer system of claim 4 wherein said wafer is a semiconductor wafer having 300-mm diameter, and said transport carrier is a FOUP.

6. The wafer transfer system of claim 3, further comprising:

(a) a Test Wafer Station mounted adjacent to a first instance of said at least one Wafer Transfer Robot, said Test Wafer Station supporting therein a third collection of wafers in a horizontal orientation; and (b) said first instance of at least one Wafer Transfer Robot adapted for transferring said wafer between any two of said first collection of wafers, said second collection of wafers, and the third collection of wafers.

7. The wafer transfer system of claim 6 wherein a second instance of said at least one Wafer Transfer Robot is mounted adjacent to said Test Wafer Station opposite said first instance of said at least one Wafer Transfer Robot, said second instance of said at least one Wafer Transfer Robot being adapted for transferring said wafer between any two of said first collection of wafers associated with the second instance of said at least one Wafer Transfer Robot, said second collection of wafers associated with the second instance of said at least one Wafer Transfer Robot, and the third collection of wafers associated with said Test Wafer Station.

8. The wafer transfer system of claim 7 wherein said wafer is a semiconductor wafer having 300-mm diameter, and said transport carrier is a FOUP.

9. The wafer transfer system of claim 4, further comprising:

(a) a Test Wafer Station mounted adjacent to said first instance of at least one Wafer Transfer Robot and opposite to said Integrated Notch Aligner, said Test Wafer Station supporting therein a third collection of wafers in a horizontal orientation; and (b) said first instance of at least one Wafer Transfer Robot adapted for transferring said wafer between any two of said first collection of wafers, said second collection of wafers, and the third collection of wafers.

10. The wafer transfer system of claim 9 wherein said wafer is a semiconductor wafer having 300-mm diameter, and said transport carrier is a FOUP.

11. A method for transferring a first collection of wafers having a generally horizontal orientation from a transport carrier having a first collection of slots for support of said first collection of wafers, to a cassette having a second collection of slots adapted to support a second collection of wafers, and placing said cassette onto a shelf within a Storage Area with said second collection of wafers in a vertical orientation, comprising the steps of:

(a) manipulating a Wafer Transfer Robot having an end effector to extract a wafer from a horizontal transfer plane within said transport carrier, said wafer being a lowermost one of said first collection of wafers;

(b) moving a Cassette Inversion Mechanism vertically to align an uppermost unoccupied slot within said cassette, said cassette being supported by said Cassette Inversion Mechanism, to be horizontally coplanar with said wafer;

(c) moving said Wafer Transfer Robot laterally and substantially 180° rotationally to place said wafer held by said end effector into said uppermost unoccupied slot within said cassette;

(d) withdrawing said end effector of said Wafer Transfer Robot from said cassette so as to deposit said wafer within said cassette;

(e) indexing both of said Wafer Transfer Robot and said Cassette Inversion Mechanism upward to align said horizontal transfer plane to the next lowermost one of said first collection of wafers within said transport carrier and the next uppermost unoccupied slot within said cassette;

(f) repeating steps (a) through (e) sequentially until the first occurrence of said transport carrier having no occupied slots or said cassette having no unoccupied slots;

(g) manipulating said Cassette Inversion Mechanism to invert said cassette and said second collection of wafers contained therein so that the orientation of said second collection of wafers is changed from generally horizontal to generally vertical;

(h) positioning a Cassette Buffer Handling Mechanism having a gripper to cause said gripper to attach to said cassette;

(i) causing the Cassette Buffer Handling Mechanism to withdraw said cassette from said Cassette Inversion Mechanism;

(j) repositioning said Cassette Buffer Handling Mechanism to move said cassette into an unoccupied position above a shelf within said Storage Area; and (k) causing said gripper of said Cassette Buffer Handling Mechanism to release, thereby setting said cassette containing said second collection of wafers onto said shelf in proximity to an adjacent processing bench, said second collection of wafers now being oriented generally vertical.

12. A method according to claim 11 wherein said wafer is a semiconductor wafer having 300-mm diameter, and said transport carrier is a FOUP.

13. A method according to claim 11 further accomplishing the function of an Integrated Notch Aligner, wherein step (c) is replaced by the steps of:

(c1) moving said Wafer Transfer Robot first laterally then substantially 90° rotationally to place said wafer held by said end effector centered above a vacuum chuck;

(c2) moving said Wafer Transfer Robot vertically downward to deposit said wafer no longer supported by said end effector onto the vacuum chuck;

(c3) rotating said vacuum chuck with said wafer attached by suction to the vacuum chuck until a visioning system locates a notch in the edge of said wafer;

(c4) releasing the suction and moving said Wafer Transfer Robot vertically upward to lift said wafer now held again by said end effector from the vacuum chuck; and (c5) moving said Wafer Transfer Robot laterally and substantially another 90° rotationally to place said wafer held by said end effector into a cassette supported by said Cassette Inversion Mechanism.

14. A method according to claim 13 wherein said wafer is a semiconductor wafer having 300-mm diameter, and said transport carrier is a FOUP.

15. A method for transferring a first collection of wafers from a vertical orientation within a cassette on a shelf in a Storage Area to a transport carrier having support for a second collection of wafers in a horizontal orientation, said cassette having a first collection of slots for support of said first collection of wafers, and said transport carrier having a second collection of slots for support of said second collection of wafers, comprising the steps of:

(a) positioning a Cassette Buffer Handling Mechanism having a gripper to locate said cassette on said shelf within said Storage Area;

(b) causing said gripper to attach to said cassette;

(c) manipulating said Cassette Buffer Handling Mechanism to lift said cassette from said shelf, and transfer said cassette to a Cassette Inversion Mechanism;

(d) inverting said cassette and said first collection of wafers contained therein so that the orientation of said first collection of wafers is changed from generally vertical to generally horizontal by the motion of said Cassette Inversion Mechanism;

(e) positioning the Cassette Inversion Mechanism vertically so that a wafer, said wafer being a lowermost one of said first collection of wafers supported within the cassette being held by the Cassette Inversion Mechanism, is coplanar with a horizontal transfer plane containing an uppermost unoccupied slot from among said second collection of slots within said transport carrier;

(f) manipulating a Wafer Transfer Robot having an end effector to extract said wafer from said horizontal transfer plane within said cassette;

(g) moving said Wafer Transfer Robot laterally and substantially 180° rotationally within said horizontal transfer plane to place said wafer held by said end effector into said uppermost unoccupied slot among said second collection of slots of said transport carrier;

(h) withdrawing said end effector of said Wafer Transfer Robot from said transport carrier so as to deposit said wafer held by said end effector into said transport carrier;

(i) indexing both of said Wafer Transfer Robot and said Cassette Inversion Mechanism downward to align said horizontal transfer plane to a next uppermost unoccupied slot among said second collection of slots within said transport carrier, and a next lowermost occupied slot within said cassette; and (j) repeating steps (f) through (i) sequentially until the first occurrence of said transport carrier having no unoccupied slots or said cassette having no occupied slots.

16. A method according to claim 15 wherein said wafer is a semiconductor wafer having 300-mm diameter, and said transport carrier is a FOUP.

* * * * *